(12) United States Patent
Obweger et al.

(10) Patent No.: US 8,791,614 B2
(45) Date of Patent: Jul. 29, 2014

(54) DEVICE FOR TREATING DISC-LIKE ARTICLE AND METHOD FOR OPERATING SAME

(75) Inventors: Rainer Obweger, Lind Im Drautal (AT); Frank Werfel, Arzberg (DE)

(73) Assignee: Lam Research AG, Villach (AT)

( * ) Notice: Subject to any disclaimer, the term of this patent is extended or adjusted under 35 U.S.C. 154(b) by 367 days.

(21) Appl. No.: 13/139,407

(22) PCT Filed: Dec. 11, 2009

(86) PCT No.: PCT/IB2009/055695
§ 371 (c)(1),
(2), (4) Date: Jun. 13, 2011

(87) PCT Pub. No.: WO2010/070562
PCT Pub. Date: Jun. 24, 2010

(65) Prior Publication Data
US 2011/0250044 A1     Oct. 13, 2011

(30) Foreign Application Priority Data
Dec. 19, 2008   (AT) ................................ A 1987/2008

(51) Int. Cl.
*H02K 49/00* (2006.01)
(52) U.S. Cl.
USPC .......................................... 310/103; 310/114
(58) Field of Classification Search
USPC ........................... 310/103, 112–114; 414/757
See application file for complete search history.

(56) References Cited

U.S. PATENT DOCUMENTS

| 4,285,553 | A | * | 8/1981 | Robinson | ..................... 310/90.5 |
| 4,674,521 | A | * | 6/1987 | Paulfus | ..................... 134/167 R |
| 4,711,610 | A | * | 12/1987 | Riehl | ............................. 409/141 |
| 4,856,456 | A | * | 8/1989 | Hillman et al. | ............... 118/500 |

(Continued)

FOREIGN PATENT DOCUMENTS

| JP | 08-001475 | 1/1996 |
| JP | 11-026424 | 1/1999 |

(Continued)

OTHER PUBLICATIONS

International Search Report dated Aug. 17, 2010, in PCT application.

(Continued)

*Primary Examiner* — Thanh Lam
(74) *Attorney, Agent, or Firm* — Young & Thompson

(57) ABSTRACT

A device for supporting and rotating a disc-like article includes:
a first rotor including a support for supporting the disc-like article, wherein the first rotor is located within a process chamber,
a second rotor connected to a drive mechanism for rotating the second rotor, wherein the second rotor is coupled to the first rotor by magnetic forces without touching the first rotor, and the second rotor is located outside the process chamber and a wall is arranged between the first rotor and the second rotor, and
at least one magnetic couple, wherein the couple includes a first coupling part and a second coupling part, wherein the first coupling part includes a coupling magnet mounted to the first rotor and the second coupling part includes a high temperature superconducting material, wherein the magnetic couple(s) are arranged and/or formed so that no degree of freedom remains between the first and second rotor so that the first rotor moves together with the second rotor. A method for operating such device is disclosed.

20 Claims, 5 Drawing Sheets

(56) References Cited

U.S. PATENT DOCUMENTS

| | | | |
|---|---|---|---|
| 5,314,869 A | | 5/1994 | Pandey |
| 5,376,862 A | * | 12/1994 | Stevens ........................ 310/75 D |
| 5,439,519 A | | 8/1995 | Sago |
| 5,539,266 A | * | 7/1996 | Stevens ........................ 310/75 D |
| 5,871,588 A | * | 2/1999 | Moslehi et al. ................ 118/730 |
| 6,485,531 B1 | | 11/2002 | Schob |
| 2010/0289200 A1 | * | 11/2010 | Fukui et al. ........................ 269/8 |

FOREIGN PATENT DOCUMENTS

| | | |
|---|---|---|
| JP | 2002-212729 | 7/2002 |
| JP | 2006-101585 A | 4/2006 |
| JP | 2006-122785 A | 5/2006 |
| JP | 2006-173639 A | 6/2006 |
| JP | 2007160282 A | 6/2007 |
| JP | 2008-073636 | 4/2008 |
| WO | 2007/101764 | 9/2007 |

OTHER PUBLICATIONS

Translation of Japanese Office Action, dated Dec. 24, 2013, from corresponding JP application.

* cited by examiner

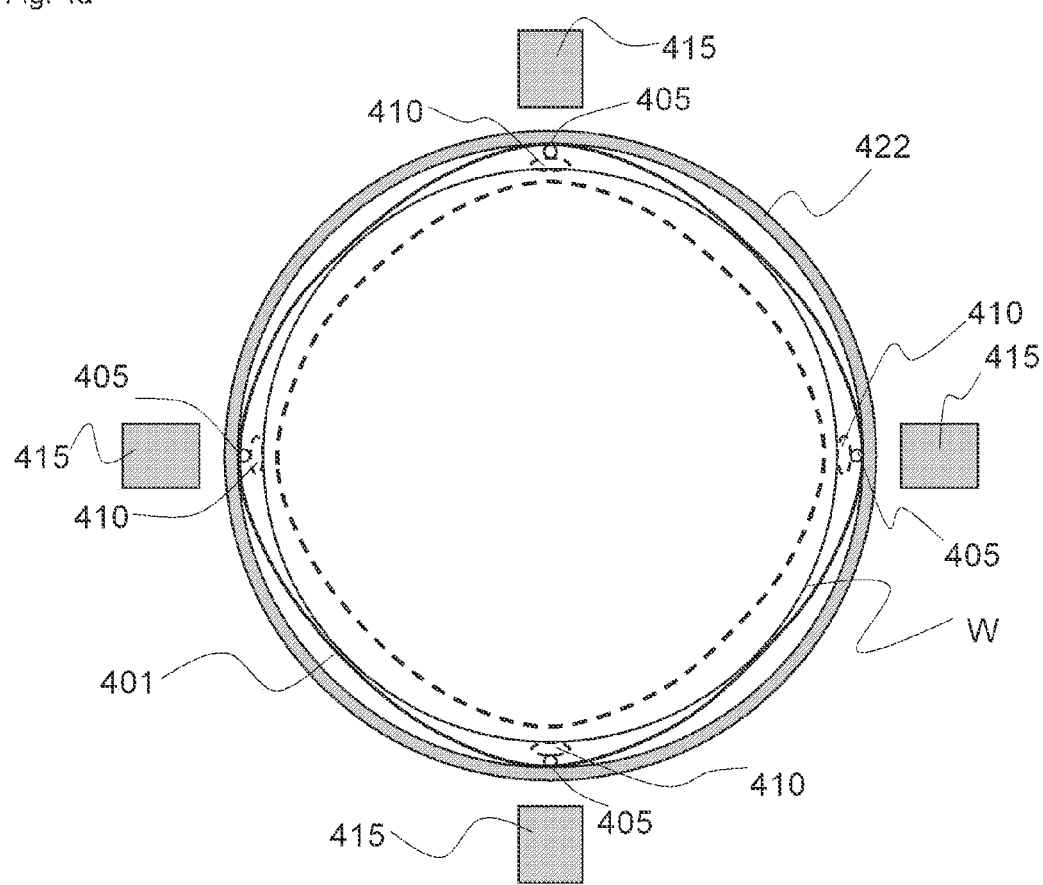

DEVICE FOR TREATING DISC-LIKE ARTICLE AND METHOD FOR OPERATING SAME

TECHNICAL FIELD

The invention refers to a device for supporting and rotating a disc-like article with a rotor comprising a support for supporting the disc-like article, wherein the rotor is located within a process chamber.

BACKGROUND ART

WO 2007/101764 A1 discloses a device for fluid treatment of a plate-like article comprising a rotary head for holding and rotating a plate-like article around a rotation axis, drive means to suspend and drive the rotary head without contact, the drive means being arranged radially around the rotary head, a substantially cylindrical wall, which is substantially concentric to the rotation axis, wherein the cylindrical wall is arranged between the rotary head and the drive means.

A suitable driving mechanism is described in U.S. Pat. No. 6,485,531. With the herein disclosed active magnetic bearing and drive mechanism the distance of stator to rotor is limited. This results in a low wall thickness. Furthermore such active bearing and drive mechanism may lead to undesired current induction in the integrated circuits of the disc-like article. It is an object of the invention to provide an improved drive mechanism. Another object of the invention is to provide a system, which allows the use of a thicker wall.

DISCLOSURE OF INVENTION

The invention solves the problems by providing a device for supporting and rotating a disc-like article comprising:
- a first rotor comprising a support for supporting the disc-like article, wherein the first rotor is located within a process chamber
- a second rotor connected to a drive mechanism for rotating the second rotor, wherein the second rotor is coupled to the first rotor by magnetic forces without touching the first rotor, and the second rotor is located outside the process chamber and a wall is arranged between the first rotor and the second rotor;
- at least one magnetic couple, wherein the couple comprises a first coupling part and a second coupling part, wherein the first coupling part comprises a coupling magnet mounted to the first rotor and the second coupling part comprises a high temperature superconducting material (HTS), wherein the magnetic couple(s) are arranged and/or formed in a way so that no degree of freedom remains between the first rotor and the second rotor so that the first rotor moves together with the second rotor.

The first rotor can be located above the second rotor. Alternatively the first rotor is coaxially arranged within the second rotor. In both cases the first rotor is located within the process chamber and can thus be called the inner rotor whereas the second rotor can be called the outer rotor. The wall may have a form, which is selected from the group of geometric shapes consisting of a sphere, a plane, cylinder, cone, and other rotational symmetric form. If the wall is a cylinder the first rotor and the second rotor are arranged radially. The first rotor and the second rotor can be lifted and lowered simultaneously with respect to the wall. The at least two couples may share the second coupling part that comprises a HTS, e.g. if the HTS is an annular ring. In such a case the second coupling part of both couples are regions of one and the same HTS. As the magnetic couple rotates together with the disc-like article (e.g. semiconductor wafer) no current will be induced in possible electrical circuits on the disc-like article, which is a significant advantage to active magnetic bearings as proposed by U.S. Pat. No. 5,439,519. The production of melt-textured FITS is disclosed in Werfel, Flögel-Delor, Wippich, "YBaCuO Large Scale Melt Texturing in a Temperature Gradient", Inst. Phys. Conf. Ser. No, 158, 5.821 ff., 1997. With the above-described assembly the magnetic coupling between the first rotor and the second rotor provides a one- to one transfer of all movements of the second rotor to the first rotor, especially the rotation movement. This arrangement can be used when the process chamber is a closed chamber for chemical or gaseous media.

The coupling magnet(s) mounted to the first rotor preferably are permanent magnet(s). However, alternatively electromagnet(s) or even HTS can be used.

With such an assembly it is possible to process a wafer at elevated temperatures (e.g. 20° C.-200° C.) and although the HTS is kept cool (below 90 K). With such an assembly it is also possible to place the first rotor in a vacuum vessel (down to 100 mPa to 100 nPa) or a pressure vessel (200 kPa-10 MPa). Therefore such an assembly can be used for vacuum processes such as CVD or plasma-etching and for pressure processes such as for hot liquids (e.g. liquid water at 150° C.) and supercritical fluids. Such an assembly can be used in a device as disclosed in WO 2007/101764 A1.

In an embodiment two magnetic couples are provided wherein each magnetic couple comprises at least one coupling magnet. If a permanent magnet is used as the coupling magnet, the permanent magnet is advantageously selected from the group comprising ferromagnetic magnets (comprising Fe, Ni, Co), or Rare-Earth magnets, e. g. $Nd_2Fe_{14}B$ (NIB) and SmCo magnets (SmCo ($SmCo_5$, $Sm_2Co_{17}$). SmCo is useful for high temperature applications up to 350° C. because of its high Curie Temperature of 700-800° C.

In another embodiment the HTS is placed in a thermal insulating vacuum cryostat, which is cooled by adding liquid nitrogen or a cryo-cooler. A cryo-cooler is a cooler capable of generating very low temperatures below 100 K. Examples for such cryo-coolers are Stirling-cooler, Gifford McMahon cooler, and Pulse Tube cooler.

In one embodiment at least one magnetic couple comprises a coupling magnet with a magnetic field, which does not follow the arc symmetry of the annular rotor track or in other words is not cylindrical symmetric. Such a magnetic field, which is not cylindrical symmetric, will lead to a magnetic field distribution in the HTS, which is also not symmetric. Consequently the HTS and the coupling magnet will be coupled to each other in a way so that no degree of freedom between both is left.

Alternatively two coupling magnets are provided that have magnetic fields, which are arranged so that the magnetic axis of their magnetic fields are not identical, so that no degree of freedom remains between the first rotor and the second rotor. Such non-identical axes are parallel axes, skew-whiff axes, or intersecting axes. In this case the magnetic fields provided by the coupling magnets are higher compared to one magnet with stronger field gradients and may be uniform rotational symmetric.

The second coupling part may be assembled in a single crystalline structure or as a ring of crystal blocks.

In one embodiment the second coupling part comprises a high temperature superconducting (HTS) material in form of crystal blocks, which are assembled in an annular geometry with the crystallographic c axes directed to the first coupling parts. With such an assembly the coupling forces are increased.

In another embodiment the high temperature superconducting material is a melt textured high temperature superconducting (HTS) material, which significantly increases the pinning forces between the HTS and the coupling magnets. Preferably the melt textured high temperature superconducting (HTS) material comprises a composition $RE_{1+x}Ba_2Cu_3O_{7-\delta}$ (RE-Y, Sm, Nd, Dy, Gd), wherein x is in the range of 0.1 to 0.8 (preferably 0.2 to 0.6), and δ is in the range of 0 to 0.5 (preferably 0.03 to 0.25). This further increases the pinning forces.

In one embodiment the HTS is integrated in a vacuum cryostat ensuring thermal insulation and maintaining the necessary low temperature during the operation. Preferably the vacuum cryostat is cooled by a cooling element or by keeping a reservoir of a refrigerant with a boiling temperature at 100 kPa lower than the critical superconducting temperature (Tc) of the HTS. A suitable refrigerant is liquid nitrogen with a boiling temperature of 77 K (−196° C.) at 100 kPa. Other possible cooling phases are liquid oxygen (90 K), liquid neon (27K), liquid hydrogen (20 K) and liquid helium (4.2 K).

In an embodiment the second rotor comprises a monolithic ring of HTS in a vacuum cryostat arranged in proximity of a bottom of a semiconductor processing chamber and interacting with axial coupling properties with magnetic rotor carrying a silicon wafer inside the chamber. In this case the monolithic ring of FITS is element of both magnetic couples—e.g. two separate permanent magnets are coupled to the same monolithic ring.

In one embodiment the first coupling parts comprise permanent magnet with long-range field distribution due to an optimum geometrical aspect ratio of permanent magnet height to width equal to one or larger (preferably 0.8 to 1.5). For given mass of the permanent magnet an optimum geometry exists for a long range maximum of flux density.

Advantageously the symmetry axis of the magnetic field of the coupling magnets goes through the HTS. If a plurality of annularly arranged coupling magnets is used it is advantageous if the coupling magnets of the first coupling parts in circumference direction show an alternate magnetic polarization vector.

In an embodiment the coupling magnets are arranged in a configuration so that it produces a magnetic gradient (gradient of magnetic flux density dB/dx) with a vector perpendicular to the direction of rotor movement.

In another embodiment the rotor wafer carrier clamped the wafer using a double pin construction with magnetic attraction and turns with a speed of 10 to 3000 rpm. The pin construction with magnetic attraction consists of a lower and an upper pin ring whereby vertical neighbouring conical pin pairs with a small rim offset clamp the wafer magnetically.

Advantageously the cryostat is directly coupled to an integrated cryo-cooler providing the cooling power and turning parallel to the cryostat. With an integrated cryo-cooler the necessary power supply is provided by a rotating voltage and current feeder.

Advantageously the first rotor as well as the second rotor are carefully mass balanced, which is helpful for spin speeds above 150 rpm and reduces asymmetric centrifugal forces as well as rotor dynamics problems.

In one embodiment between the opposing surfaces of HTS and coupling magnet there is a gap with a width in a range of 0.5-60 mm.

In another embodiment the first rotor and the second rotor comprise magnetic couples, which are radially movable so that the first coupling elements may change the distance to the rotational axis so that portions of the first rotor may hold or release a disc-like article. Thereby, the second rotor consists of at least two individual cryostats on a platform moveable in radial direction. Individual cryostats may be arc shaped.

In one embodiment the first rotor comprises at least two segments which are not directly connected to each other. Not directly connected to each other in this respect means that each first coupling element is magnetically coupled to the corresponding second coupling element and can be radially moved with respect to the rotation axis. The second coupling element may be radially movably attached to a second rotor. Therefore the not directly connected first coupling elements are indirectly connected to each other via magnetic forces and the second rotor.

Alternatively the first coupling elements are radially movably mounted on a first rotor. In such embodiment the first coupling elements on the one hand drive the rotor and on the other hand can clamp and release the disc-like article.

In one embodiment (with the radially movable magnetic couples) the radial positions of the second coupling elements are controlled with respect to the spin speed of the first rotor in order to compensate the centrifugal force acting on the first coupling elements.

Alternatively (or even cumulatively) auxiliary magnets are provided in order to compensate the centrifugal force acting on the first coupling elements. Additionally means to alter the radial position of the auxiliary magnets may be provided.

Such auxiliary magnets may be solenoids, and the magnetic force can be changed by the solenoid current depending on the spin speed of the first rotor.

Another aspect of the invention is a method of running such an above-described device. Herein the first rotor is held in close proximity and co-axially to the second rotor when the HTS has a first temperature T1 above the critical temperature (Tc). The gap distance of the first rotor to the second rotor is kept at a fixed width in the range of 0.5-60 mm during cooling the HTS to a second temperature T2 below the critical temperature Tc. Thereafter the first rotor is released and the first rotor levitates without touching the wall.

During this cooling of the HTS the first rotor is held by auxiliary holding means which can be removed once T2 below Tc is reached. Then the first rotor freely levitates without touching the chamber walls and is pinned by magnetic forces to the second rotor.

In one embodiment the HIS are taught by magnetic fields deriving from an auxiliary magnet, which is different from the coupling magnet, which is element to the first coupling part. The shape of the magnetic field of the auxiliary magnet is similar to the shape of the coupling magnet (e.g. a dipole-like magnetic field), so that the direction of the field vector deviates not more than 10° (preferably not more than)2°, the orientation is the same and the centre differs not more than 2 mm to the centre of the permanent when placed into position. However, the magnetic field of the auxiliary magnet shall be stronger than that of the coupling magnets, which are element of the first rotor.

The auxiliary magnet can be an electromagnet (solenoid) providing an electromagnetic field before the temperature of the HTS has reached the critical temperature Tc, and the electromagnetic field is held until the temperature of the HTS is below the Tc. With such a method the pinning forces can be sufficiently increased.

A superconducting high magnetic gradient coupling device utilizes a first compact superconducting part (driving rotor, first rotor) spaced apart from a second magnetic part (driven rotor, second rotor). Both parts may be in ring or cylinder shape of large diameter of preferably at least 300 mm and are able to rotate. The basic functional geometry of both parts neighbouring can be axial or radial. The superconducting first part contains a high Tc superconductor of the Cuprate type which is integrated in a vacuum cryostat ensuring thermal insulation and maintaining the necessary low temperature during the operation. The first part is in a single crystalline structure or a plurality of crystal blocks assembled in a ring.

Preferably the crystallographic orientation of the blocks having the c axis perpendicular to top surface is parallel to the magnet polarization vector. The deviation range shall be within +/−30° to generate a high coupling force.

The second magnet excitation part (included in the driven rotor) is spaced apart and integrated in a wafer carrier preferably with pins for clamping and holding large-diameter Silicon wafers (100-450 mm diameter). It is located closest to the bottom (axial coupling) or closest to the outer wall (radial coupling) of a vessel or process chamber to allow strong magnetic interaction between magnet configuration and superconductor. After field cooling (fc) procedure the first superconductor levitates at a distance the magnetic assembly wafer carrier by magnetic forces. FC is performed by cooling down the HTS to a temperature lower than the critical temperature Tc of the HTS and simultaneously trapping a large part of the external magnetic flux density.

A variety of magnet to superconductor configurations are conceivably and their individual performance may differ substantially according to the application. The coupling forces are strongly dependent on the coupling magnet excitation. Design of a magnet configuration shall be considered in order to achieve large electromagnetic forces, In addition, the quality of the magnet material and geometrical arrangement determines the coupling forces. For an efficient coupling the magnet configuration shall show a high flux density and a high gradient of the flux whereby the field vector should have an off-track orientation preventing any degree of movement freedom.

Generally, if the gap distance g of the permanent magnet to the superconductor is more than 10 mm. (g>10 mm) operation a single magnet gives the highest magnetic flux per magnetic mass at longer distances from the magnet surface. The single magnet shows the classical dipole field without any flux compression or dilatation.

Key parameter of a superconducting magnet coupling is the obtained electromagnetic force due to the interaction between a superconductor and a magnet (e.g. permanent magnet). The most prominent and advanced bulk material is melt textured YBCO following the chemical composition $RE_{1.2-1.6}Ba_2Cu_3O_{7-\delta}$ (RE=RARE EARTH selected from the group of Y, Sm, Nd, Gd, Dy). An important part of the material is one or more non-superconducting phases providing pinning centres. Most prominent pinning phase is the green phase $RE_2BaCuO_5$ (211 phase) driving the melt textured YBCO up to critical current densities Jc in the order of 50-100 $kA/cm^2$ at 77 K and zero applied magnetic field. The maximum trapped field in YBCO is more than 1 Tesla at 77 K and can be as high as 16 Tesla at lower temperatures around 30 K. At lower temperatures <40 K the maximum trapped field is limited by mechanical material properties like material tensile strength. The important electrical property of the HTS material is the effectiveness of the pinning centres leading to a high intrinsic critical current Jc and capable to maintain a high trapped magnetic field.

Hence, a preferred form of the invention utilizes single grain high Tc material with crystal sizes of 3-4 cm and larger having critical current values of $Jc>10^4 A/cm^2$ and producing individual trapped magnetic flux distribution in a minor-like transformation corresponding to the permanent magnet arrangement. Crystal size herein is defined as the linear extension in the crystal plane.

Besides of the two main components of a HTS coupling, magnet and superconductor, the entire structure of a complete apparatus device is more complex. The superconductors on the driving rotor side are preferably assembled in a Cu housing and attached to a cold stage; either cooled by liquid nitrogen or adapted to cold head of a cryo-cooler (Stirling, Gifford McMahon, Pulse Tube).

To maintain the cryogenics stable during operation either the entire coupling is located in an evacuated tube ($<10^{-2}$ Pa) or the driving rotor cold side is separated by a thin walled tube of stainless steel or fiberglass. Particular sensitive is the wall between driven rotor magnets and the driving rotor HTS rings. The material has to be thin, nonmagnetic, mechanical stable and high-vacuum compatible.

To obtain a perfect thermal insulation of the HTS-material a high gradient thermal super-isolation technology with temperature gradients up to 200 K/mm has been developed and tested. The highly compact insulation structure reduces cryogenic effort and allows small distance high coupling forces. An integrated cryo-pump system provides the necessary vacuum insulation. Alternatively, the use of cryo-cooler enables lower temperatures (40-70 K) compared to liquid nitrogen and allows higher magnetic forces.

According to the magnetic interaction the coupling device can hold or rotate wafers in partly open vessels or closed chambers. Due to the non contact interaction wafer processing at higher pressure becomes possible. Because of homogeneity and the open ring geometry of the magnetic part the wafer can be processed double sided under rotation.

Higher process temperatures up to 200° C. are possible. Extremely aggressive chemicals or gaseous solutions like fluorine acids may also be used if the magnetic wafer carrier is surface covered by protective layer of PFA (Perfluorinated Vinyl Ether) or ECTFE (Ethylene Chlorotrifluoro Ethylene).

BRIEF DESCRIPTION OF DRAWINGS

FIGS. 4c and 4d show schematic cross-sectional top and side views of a fourth embodiment in closed position.

MODE(S) FOR CARRYING OUT THE INVENTION

Figure 1A:
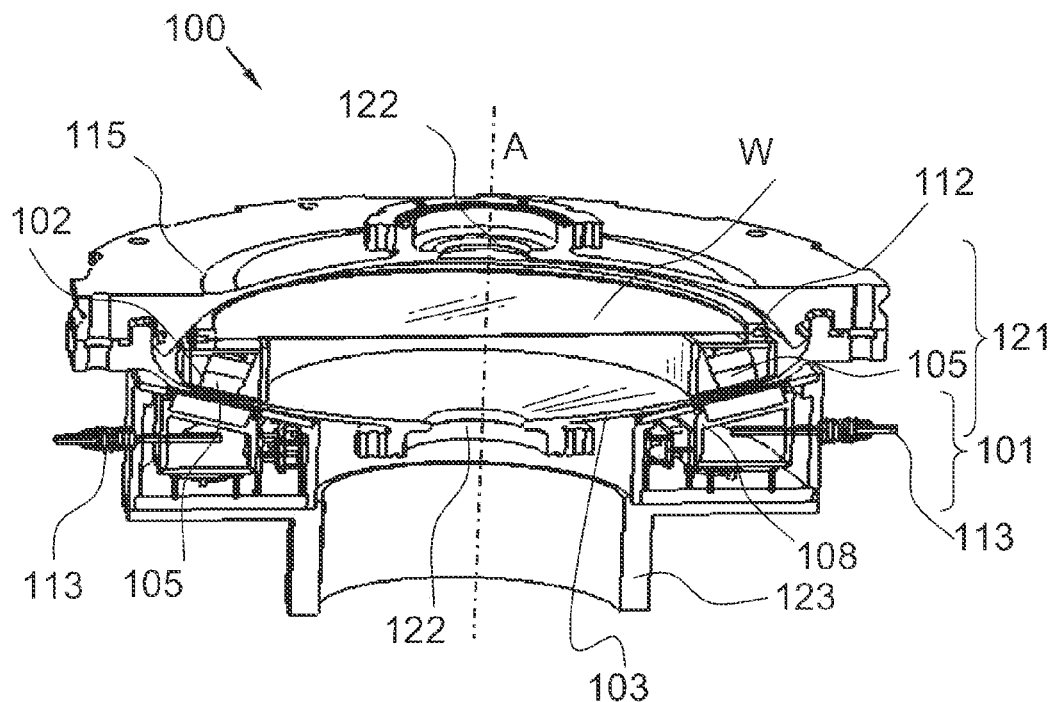
FIG. 1a shows a schematic cross-sectional perspective view of a first embodiment
Figure 1B:
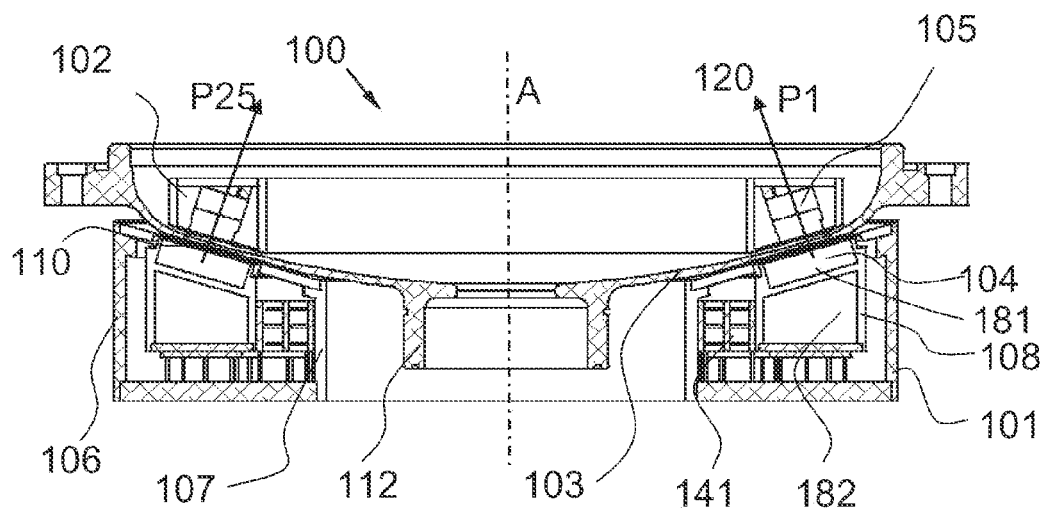
FIG. 1b shows a schematic cross-sectional view of the first embodiment
Figure 1C:
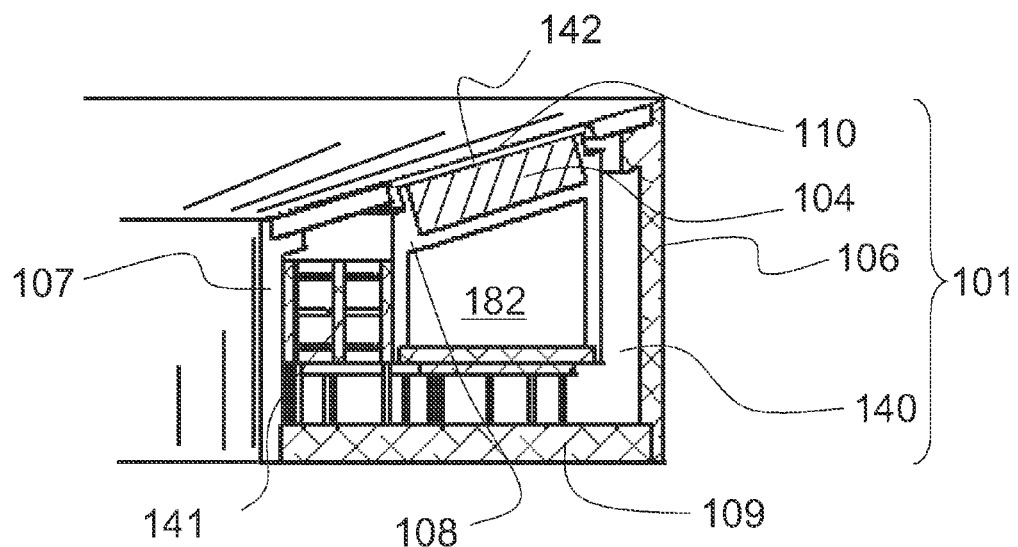
FIG. 1c shows a schematic cross-sectional detail view of the cryostat accommodating the HTS of the first embodiment

With reference to FIGS. 1a, 1b, and 1c is a first embodiment of the invention shall be described. A magnetic levitated system 100 operates through the bottom 103 of the semiconductor processing chamber 121. The silicon wafer W is fixed on a magnetic wafer carrier 112 and rotated without any mechanical contact in sealed process chamber 121. The process chamber 121 comprises a bottom 103 in the shape of a Kloepper bottom to withstand mechanical forces at lowest wall thickness in case of forces due to high pressure or vacuum in side the process chamber 121. The process chamber 121 is made of stainless steel or non-metallic compound material. The HTS magnetic coupling features a radial symmetric superconducting driving rotor 101 below the chamber and above it with an axial spacing a large driven rotor 102 inside the chamber. Driving rotor 101 and driven rotor 102 are separated by the nonmagnetic chamber wall 103, which is bridged by magnetic forces. The driving rotor 101 has a ring structure with integrated annular arranged permanent magnets 105 (the coupling magnets). The arrangement of the permanent magnet 105 can be vertical or under an angle. The individual positioned permanent magnet's 105 are faced with their polarization vectors Pi ($i=1-n$; e.g. $n=48$) towards or from the superconductors 104. The driven rotor 102 supports a wafer carrier 112 with pins to hold the silicon wafer. The driving rotor 101 and driven rotor 102 turn around a vertical axis whereby all turning parts have to be mass balanced. For safe operation driving rotor 101, driven rotor and wafer have to turn around a common centre line without any mechanical contact to the out or inner chamber wall. The air gap between the rotating parts and the static bottom should be >0.5 mm.

The driven rotor 102 is suspended and coupled by the superconducting driving rotor 101 with cryostat. Each movement of the driving rotor 101 is followed by an equivalent reaction of the rotor 102.

The embodiment of the driving rotor 101 cryostat is determined by three factors: (i) cryostat housing 106 having high mechanical stability to withstand large axial and radial forces; (ii) Thermal insulation 140, 141 of the cold superconductor inside the housing; (iii) bottom flange 123 with connection to a rotational drive unit.

The structure of encapsulation of the HTS 104 for liquid nitrogen cooling is shown in detail in FIG. 1c. The driving rotor 101 comprises a vacuum cryostat, which consists of a threefold shell structure to minimize heat conduction from ambient temperatures to the liquid nitrogen cooled superconductor 104. It includes an outer case 106 of cylindrical shape fabricated of non-magnetic composite material (G-10, glass fibre reinforced material) and an inner about 1 mm thick glass and graphite fiber composite ring 107. Both tubes have to withstand mechanically the air pressure and are vacuum-tight. Both rings are connected by a ring-shaped lower plate 109 (a thick G-10 plate) at the bottom and a thin stainless steel cover 110 at the top. The top cover 110 is made as thin as possible (0.1 mm) to maintain a short magnetic interaction distance between the permanent magnet 105 of the driven rotor and the HTS 104 of the driving rotor 101. This part is fabricated by non-magnetic stainless steel in the desired geometry.

In the space between the inner ring wall 107 and outer ring wall 106, a copper ring 108 for liquid nitrogen storage in the lower part 182 and for accommodating the FITS 104 in the upper part 181 is placed.

Cryogenics of the superconductors in the cryostat is performed indirectly by conduction cooling via a copper ring 108, The upper part of the copper ring 108 contains the HTS blocks 104 machined into the exact shape and glued with glue, which has a high thermal conductivity, into of the copper holder. Superconductor 104 cryogenics is performed by conduction cooling using a liquid nitrogen storage container 182.

For optimum cryostat function heat transfer coefficients of the melt textured YBCO superconductors were determined to $\lambda=5$ W/Km between 50 and 300 K, nearly temperature independent. Under equilibrium conditions the thermal conductance is provided to obtain less than 1 Kelvin temperature difference between the liquid nitrogen and the upper surface of the HTS.

Especially critical is the thermal insulation of the cylindrical HTS driving rotor 101 in direction of the top cover 110 because of the limited space there. The distance between the cold HTS surface and the warm gap between cryostat and process chamber above is only 2 mm consisting of the 1 mm wall thickness of the cover 110 and 1 mm vacuum space 142 between the HTS 104 and the cover 110 excluding heat transfer.

Cold part stabilization and support is constructed by geometrical structures 141 following low thermal conductive paths and ensuring a superior low thermal management. The glass fibre material possesses a high mechanical strength at a low thermal conductivity (0.2 W/K m). The meander-like structure 141 consists of small cross sectional high thermal resistance fibres, which form a plurality of spacers to the inner wall 107 and to the lower plate 109. This design ensures low heat transfer from the inner cold copper ring 108 accommodating the cold HTS 104 to the outer cryostat wall. In addition, thermal vacuum insulation 140 of better than $10^{-3}$ mbar around the cold part with multi-layer insulation minimizes the heat transfer.

The only direct connections between the inner cold part 104, 108 and the outer room temperature cryostat wall 106 are two pipes 113, which supply liquid nitrogen into the copper vessel 182, The liquid inlet and gaseous outlet pipes 113 are shown in FIG. 1a. The lines 113 are made again of material with low thermal conductivity properties like stainless steel, and simultaneously consist geometrically of thin wall tube material. The liquid nitrogen storage capacity of the copper container should have an optimum size to limit the weight on the one hand and guarantee a longer operation time of the cryostat on the other hand. In the present invention the liquid nitrogen capacity is about 1,800 $cm^3$.

In the presented preferred embodiment the insulation vacuum is improved due to an integrated cryo-pump attached at the cold copper part. The pump is thermally connected to the cold copper container 108. Zeolites or activated carbon are utilized as the material that is directly placed to the copper vessel. Cryo-pumping utilizes the physical-chemical effect that the attractive forces between an adsorbed gas molecule and as yet little covered cold surface are relatively great. To be able to absorb efficiently large amounts of gas, corresponding extended large surfaces are necessary. For this reason, porous material, like activated carbon is used. This carbon configuration has a specific porous structure giving internal surface of 500-1000 $m^2/g$. The cryo-pump material can be regenerated after a period by external heating and simultaneous evacuating.

The vacuum improvement brings the cryostat with superconductor into the $10^{-2}$ to $10^{-3}$ Pa insulation region preventing heat conduction. Because the outer vessel is made of composite material with probably small leaks and having different other materials inside the cryostat, at particular on the solder and gluing joints one expects a small steady-state leakage of the cryostat. Typically, the leakage rates measured are in the $10^{-7}$ Pa liters per second region. Therefore cryo-pumping is an essential requisite of a vacuum cryostat. Alternately, the housing can be made of stainless steel to reduce leakage rates to a lower level.

The thermal insulation and separation of the cold part 108 provided by the cryostat 101 enables the superconductors 104 to be placed in a very close proximity to the upper wall of the process chamber. Through this, advantageously, the distance between the superconductor and the magnet element can be reduced significantly which allows large magnetic coupling forces.

As illustrated in FIGS. 1a, 1b and 1c the upper cryostat cover follows the Kloepper bottom 103 (torospherical head,) angle geometry of the lower part of process chamber 121. This geometrical adaptation shows the preferred embodiment of the cryostat to reach a narrow gap distance to the rotor and permit strong magnetic interaction, Permanent magnets 105 (e.g. NdFeB or SmCo) are directly connected with the non-magnetic wafer carrier 112. Each pair of magnet 105 and superconductor 104 generates a magnetic coupling element without any degree of freedom in movement because each vector Pi (P1 and P25 are shown in FIG. 1b) is different to then next vector Pi+1. In a preferred embodiment orientation of neighbouring vectors is alternating (NS-SN-NS- . . . ). In case the magnets are mounted in alternate polarization (NS-SN-NS- . . . ) the neighbouring distance should be larger than 0.5× magnet widths, preferably larger than the magnet widths.

In an example of a possible embodiment on a carrier diameter of 12 inch (307 mm) 12 magnetic poles are provided. The number of individual poles 4 determines both the levitation force as well as the guidance force in circumferential direction. A high guidance force enables fast wafer acceleration and deceleration and determines processing throughput.

The magnetic wafer carrier 102 in FIG. 1a has a ring shape. In FIG. 1a the wafer W is clamped between the pins and an upper ring 112 by attraction forces of permanent magnets (not shown). Magnetic fixing and clamping the wafer on the edge allow free space processing from bottom and top side. The processing chamber 121 can be closed hermetically by a cover part 115 and sealed by an elastic ring for high pressure processing. Using a cylindrical connection 123 to a motor drive unit the driving rotor 101 (superconductor cryostat) turns the wafer carrier 102 inside the closed chamber without any mechanical contact by magnetic forces only.

The closed processing chamber 115 in FIG. 1a possess central feed-through 122 for pipes and tubes. A flange 123 connects the driving rotor 101 with the cryostat with a motor drive for rotation.

Figure 2:
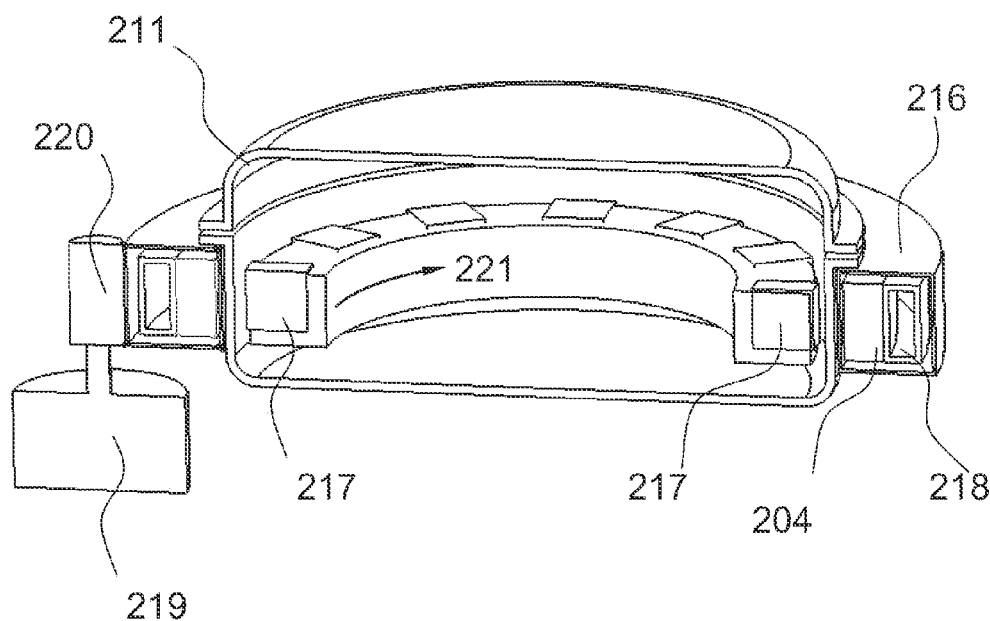
FIG. 2 is a schematic cross-sectional perspective view of a second embodiment.

It should be noted, that due to the magnetic coupling the driven rotor 102 can be easily removed from the superconducting driving rotor 101 by to a small angle one coupling part while the other one is fixed. As an example, the rotor with wafer has to be fixed in a certain position, e.g. by a robot arm while the stator is turned by half arc distance between two magnets releasing the magnetic forces and decoupling the magnetic unit. In FIG. 2 the wafer carrier 221 has 12 magnet poles in the circumference. Hence, the angle between the center of two poles is 30° and a twist of 15° between rotor and stator opens the magnetic coupling.

For smaller twist angles of 5°-8° at fixed stator the rotor has a tendency to switch back into original position. This retractable force is the limit for the applicable guidance force to accelerate or break the rotor. Even, if the driven rotor is removed from the opened process chamber the pinning forces in the superconductor allow an exact re-positioning of the rotor with reference to the driving rotor position. This rotor exchange can be repeated as long as the superconductor is under the selected cryogenic conditions.

In an another coupling geometry in FIG. 2 the superconductor cryostat 216 surrounds the process chamber 211 in a small distance and provides the magnetic forces radially to a driven rotor 221. The liquid nitrogen cooling is provided by an outer concentrical chamber 218 delivering the cryogenics to the superconductors 204. All cold parts are thermally insulated analogously to the axial configuration. A motor drive unit 219 with a shaft and a motor coupling 220 supports and drives the driving rotor 216. The driven rotor 221 together with the wafer carrier follows the cryostat movement by the magnetic forces through the (nonmagnetic) chamber wall.

In the following a method of operating a device according to the first embodiment shall be described. The device according to the first embodiment is provided in an open state (the cover 115 is removed), wherein the annular copper vessel 108 is not filled with liquid nitrogen and thus the HTS 104 has ambient temperature (well above Tc). Furthermore the driven rotor 102 is not placed in working position.

The driven rotor 102 is now placed in working position when spacers with a thickness of 0.5 mm are placed between the inner surface of the bottom wall 103 and the lower surface of the driven rotor 102. Consequently the driven rotor rests on the spacers concentrically arranged with respect to the driving rotor. Thereafter liquid nitrogen is filled into the annular copper 108 through one pipe 113. Excess gas exhausts from the annular copper vessel 108 through the opposite pipe 113. When the HTS 104 reach a temperature below the Tc the magnetic field, which derives from the permanent magnets 105 of the driven rotor 102, is trapped and pinned into the HTS. Thereafter the spacers can be removed and the driven rotor 102 levitates above the chamber wall 103 without touching it. The driven rotor 102 however is coupled (pinned) to the driving rotor 101 without touching it.

When the driven rotor 102 is coupled to the driving rotor 101 the process for treating the disc-like article W can be started. The disc-like article is loaded to the chuck 112, the chamber 121 is closed the desired pressure (vacuum of elevated pressure) is selected and the treatment fluid (gas or liquid) is applied to the disc-like article W from above and/or below.

Figure 3A:
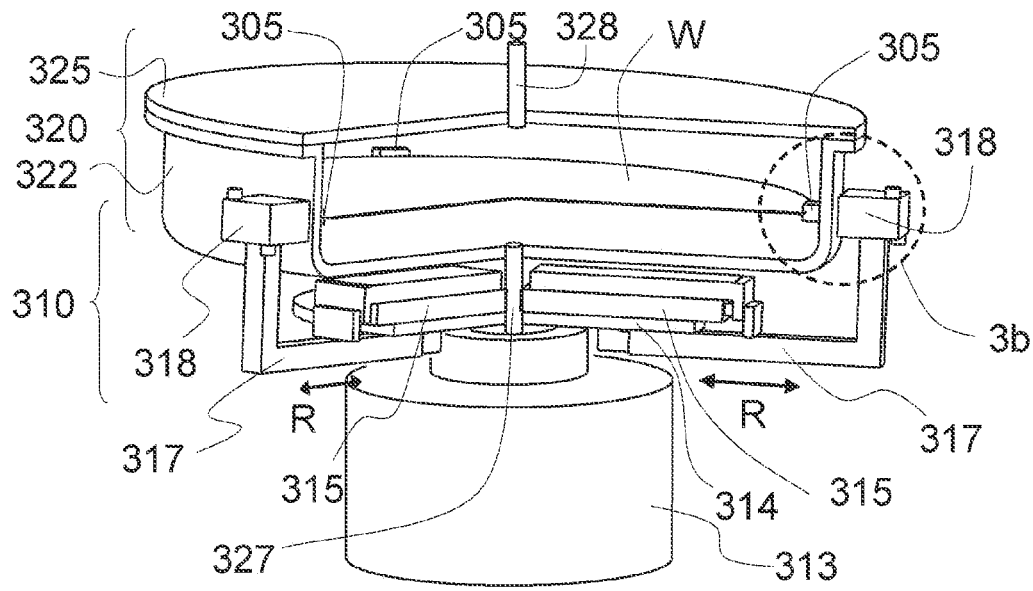
FIG. 3a shows a schematic cross-sectional perspective view of a third embodiment

FIG. 3a shows a schematic cross-sectional perspective view of a third embodiment.

Figure 3B:
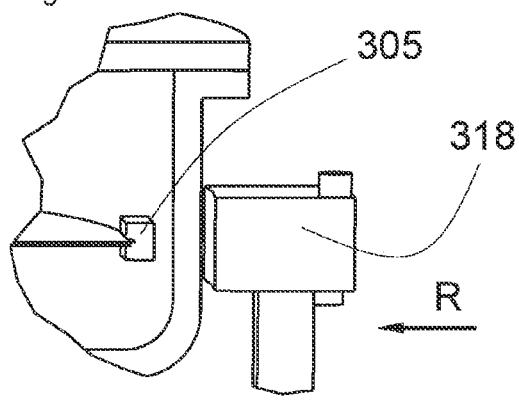
FIG. 3b shows a schematic cross-sectional detail view of a third embodiment in closed position.

Detail 3b (dotted line circle) is shown enlarged in FIG. 3b. The device comprises a chamber 320, a driving rotor 310, and a driven rotor 305. The chamber 320 comprises a bowl 322 with a basically vertical cylinder-shaped side wall. A feed pipe 327 feeds fluid (liquid and/or gas) to the bowl 322 and an exhaust pipe 328 collects used fluid.

The driving rotor 310 comprises a rotary disc 314, which is located underneath the bowl 322. The driving rotor 310 is connected to the hollow shaft of a hollow shaft motor 313. The pipe 327 leads through the hollow shaft. Three L-shaped carrier rods 317 are radially slidable mounted to the rotary disc—slidable in a direction perpendicular to the rotation axis of the rotation motion. The linear motion R of the carrier rods 317 is driven by linear modules 315. The L-shaped carrier rods 317 together encompass the bowl 322 so that the distal end of the L-shaped carrier rods 317 are arranged in a range of 5 to 60 mm away from the outer cylindrical wall of the bowl 322.

Cube-shaped cryostats 318 are mounted to the distal ends of the carrier rods 317. Within the cryostats 318 the FITS elements (not shown) are located in close proximity (0.1 to 5 mm) to the inwardly facing wall of the cryostat 318. The cryostats 318 can thus be radially moved driven by the linear modules 315. The cryostats 318 have a double containment embodiment similar to the one above-described in the first embodiment.

Figure 3C:
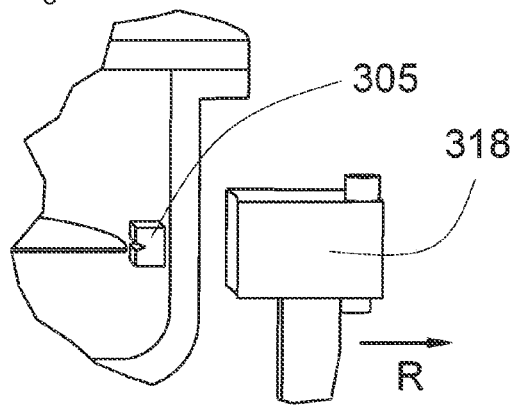
FIG. 3c shows a schematic cross-sectional detail view of a third embodiment in open position.

The driven rotor (inner rotor) comprises three gripping elements 305. Each gripping element 305 accommodates a permanent magnet, which is magnetically pinned to the HTS element when the HTS has a temperature under Tc. Therefore each gripping element 305 follows the radial movement of its corresponding HTS in the cryostat 318 as depicted in FIG. 3b (open position) and FIG. 3c (closed position). The inwardly facing surface of the gripping element 305 has a V-shaped groove to contact the edge of the disc-like article for securely gripping the disc-like article.

Following the operation of the device according to this third embodiment is described. Before starting to use the device the cryostats (at a temperature above Tc, e.g. room temperature) are moved into open position and the gripping elements 318 are brought into a desired position—each of the gripping elements close to the respective corresponding cryostat. The V-shaped groove of the gripping element 318 is inwardly facing and horizontal. In open position the gripping elements 305 may touch the inner surface of the cylindrical side wall of the bowl 322.

After the gripping elements 305 have been positioned the FITS are taught by cooling to a temperature below Tc by filling liquid nitrogen into the cryostat. Now the gripping elements are pinned to the HTS and follow all movements of the HTS (radial movement for gripping and releasing the disc-like article, vertical movement for lifting and lowering the disc-like article and rotation).

When the gripping elements are in open position (FIG. 3c) they provide enough clearance so that a disc-like article can be loaded to the chamber. Thereafter the linear modules 315 move the carrier rods 317 together with the cryostats 318 inwardly and thus the gripping elements 305 are pressed against the edge of the disc-like article W (FIG. 3h). Due to the magnetic forces pressing and gripping is soft and allows a smart handling of the disk like article in contrast to mechanical force elements. The linear modules are driven by electrical energy provided through a collector system attached to the non-rotating feed pipe 327. After the griping elements 305 touch the disc-like article the cryostats are move 1 mm further inward in order to provide necessary gripping force. At elevated rotation speed (e.g. above 500 rpm) it might be necessary to move the cryostat further inward to provide a greater force, which compensates the centrifugal force, which acts on the gripping elements.

Figure 4A:
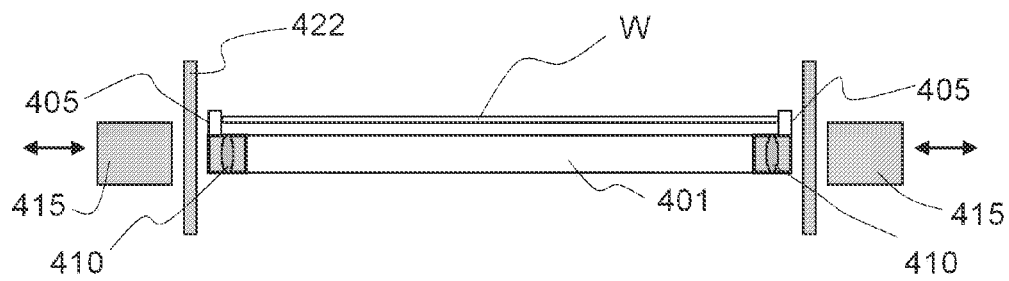
FIG. 4a and 4b show schematic cross-sectional op and side views of a fourth embodiment in open position.
Figure 4B:
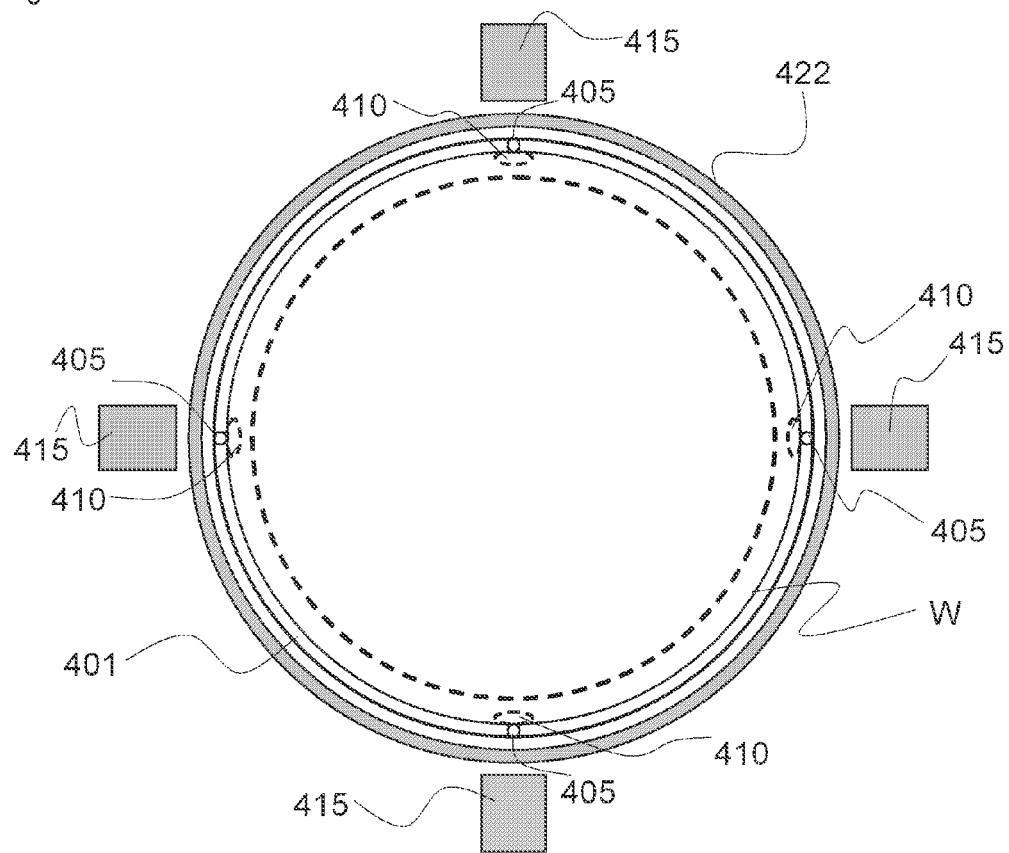

FIGS. 4a and 4b show schematic cross-sectional top and side views of a fourth embodiment in open position. FIGS. 4a and 4b show the same in closed position. The arrangement of the device according to the fourth embodiment is based on the third embodiment. The chamber (bowl, cover and cylindrical side-wall of the chamber) remain the same. Therefore only the cylindrical side-wall 422 is shown. The chamber is surrounded by four cryostats 415, which include the FITS. The cryostats 415 are rotatable and radially movable as above-described for the third embodiment.

Figure 4C:
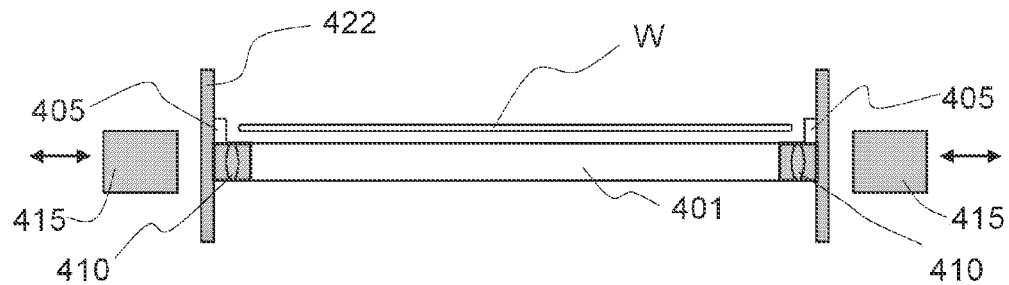

In the chamber a deformable ring 401 is levitating concentrically with respect to the cylindrical side-wall 422. In the deformable ring 401 permanent magnets 410 are located corresponding to the HTS in the cryostats 415. The permanent magnets 410 are pinned to the HTS as above-described. Therefore the deformable ring 410 deforms when the cryostats 415 are move outwardly as shown in FIGS. 4c and 4d (the open position). Adjacent to the permanent magnets 410 gripping elements 405 are mounted to the deformable ring 401. Alternatively the gripping elements 405 and the deformable ring 401 may be formed out of one block material. A suitable material is poly-tetrafluoroethene (PTFE). Other appropriate materials are: fluoroelastomers (FKM, and FEPM) such as a Viton, Tecnoflon, Fluorel, Aflas and Dai-El, or perfluoroelastomers (FFKM) Tecnofion PER, Kalrez, Chemraz, Perlast. Alternatively, a steel spring can be used, to which the permanent magnets are mounted. The spring together with the permanent magnets is covered by FIFE (poly-tetrafluoroethene) PFA (Perfluorinated Vinyl Ether), or ECTFE (Ethylene Chlorotrifluoro Ethylene).

This embodiment brings the advantage that the deformable ring 401 together with its permanent magnets 410 and the gripping elements 405 can be construed mass balanced so that it does not deform when rotating. Therefore there is no need to compensate any centrifugal force acting on the gripping elements.

The invention claimed is:

1. A device for supporting and rotating a disc-like article comprising:
    a first rotor comprising a support for supporting the disc-like article, wherein the first rotor is located within a process chamber,
    a second rotor connected to a drive mechanism for rotating the second rotor, wherein the second rotor is coupled to the first rotor by magnetic forces without touching the first rotor, and the second rotor is located outside the process chamber and a wall is arranged between the first rotor and the second rotor, and
    at least one magnetic couple, wherein the couple comprises a first coupling part and a second coupling part, wherein the first coupling part comprises a coupling magnet mounted to the first rotor and the second coupling part comprises a high temperature superconducting material (HTS) mounted to the second rotor,
    wherein the magnetic couple(s) are arranged and/or formed in a way so that no degree of freedom remains between the first rotor and the second rotor so that the first rotor moves together with the second rotor.

2. Device according to claim 1 wherein at least two magnetic couples are provided wherein each magnetic couple comprises at least one coupling magnet.

3. Device according to claim 1 wherein the HTS is placed in a thermal insulating vacuum cryostat, which is cooled by adding liquid nitrogen or a cryo-cooler.

4. Device according to claim 1 wherein at least one magnetic couple comprising a coupling magnet with a magnetic field, which does not follow the arc symmetry of the annular rotor track.

5. Device according to claim 2 wherein at least two coupling magnets have (uniform rotational symmetric) magnetic fields, which are arranged so that the magnetic axis of their magnetic fields are not identical (parallel axis, skew-whiff axis, intersecting), so that no degree of freedom remains between the first rotor and the second rotor.

6. Device according to claim 1 wherein the second coupling part is assembled in a single crystalline structure or ring crystal blocks.

7. Device according to claim 1 wherein the second coupling part comprises the high temperature superconducting material in form of crystal blocks, which are assembled in an annular geometry with the crystallographic c axes directed to the first coupling part.

8. A device according to claim 1, wherein the high temperature superconducting is a melt textured high temperature superconducting material.

9. A device according to claim 8 wherein the melt textured high temperature superconducting material comprises a composition $RE_{1+x}Ba_2Cu_3O_{7-\delta}$ (RE is selected from the group Y, Sm, Nd, Dy, Gd), wherein x is in the range of 0.1 to 0.8, and $\delta$ is in the range of 0 to 0.5.

10. Device according to claim 1 wherein the HTS is integrated in a vacuum cryostat ensuring thermal insulation and maintaining the necessary low temperature during the operation.

11. Device according to claim 10 wherein the vacuum cryostat is cooled by a cooling element or by keeping a reservoir of a refrigerant with a boiling temperature at 100 kPa lower than the critical superconducting temperature (Tc) of the HTS.

12. A device for supporting and rotating a disc-like article comprising:
- a first rotor comprising a support for supporting the disc-like article, wherein the first rotor is located within a process chamber,
- a second rotor connected to a drive mechanism for rotating the second rotor, wherein the second rotor is coupled to the first rotor by magnetic forces without touching the first rotor, and the second rotor is located outside the process chamber and a wall is arranged between the first rotor and the second rotor, and
- at least one magnetic couple, wherein the couple comprises a first coupling part and a second coupling part, wherein the first coupling part comprises a coupling magnet mounted to the first rotor and the second coupling part comprises a high temperature superconducting material (HTS),
- wherein the magnetic couple(s) are arranged and/or formed in a way so that no degree of freedom remains between the first rotor and the second rotor so that the first rotor moves together with the second rotor, and
- wherein the first rotor and the second rotor comprise magnetic couples, which are radially movable so that the first coupling elements may change the distance to the rotational axis so that portions of the first rotor may hold or release a disc-like article.

13. Device according to claim 12, wherein the radial positions of the second coupling elements are controlled with respect to the spin speed of the first rotor in order to compensate the centrifugal force acting on the first coupling elements.

14. Device according to claim 12, wherein auxiliary magnets are provided in order to compensate the centrifugal force acting on the first coupling elements.

15. Device according to claim 13, with means to alter the radial position of the auxiliary magnets.

16. Device according to claim 13, wherein the auxiliary magnets are solenoids, and the magnetic force can be changed depending on the spin speed of the first rotor.

17. Method of running a device according to claim 1, the method comprising the following steps in a time sequence
- holding the first rotor in close proximity and co-axially to the second rotor when the HTS has a first temperature T1 above the critical temperature (Tc) wherein the gap distance of the first rotor to the second rotor is in the range of 0.5-40 mm
- cooling the HTS to a second temperature T2 below the critical temperature Tc
- releasing the first rotor.

18. Method according to claim 17 wherein the HTS are taught by magnetic fields deriving from an auxiliary magnet, which is different from the coupling magnet, which is element to the first coupling part.

19. Method according to claim 18 wherein the shape of the magnetic field of the auxiliary magnet is similar to the shape of the coupling magnet, so that the direction of the field vector deviates not more than 10°, the orientation of the field vector is the same and the centre differs not more than 2 mm to the centre of the permanent when placed into position and the magnetic field of the auxiliary magnet shall be stronger than that of the coupling magnets, which are element of the first rotor.

20. Method according to claim 18 wherein the auxiliary magnet is an electromagnet providing an electromagnetic field before the temperature of the HTS has reached the critical temperature Tc and the electromagnetic field is held until the temperature of the HTS is below the Tc.

* * * * *